United States Patent
Chen et al.

(10) Patent No.: US 12,389,738 B2
(45) Date of Patent: Aug. 12, 2025

(54) OLED DEVICE, DISPLAY APPARATUS AND MANUFACTURING METHOD THEREFOR

(71) Applicant: BOE TECHNOLOGY GROUP CO., LTD., Beijing (CN)

(72) Inventors: Lei Chen, Beijing (CN); Congcong Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 922 days.

(21) Appl. No.: 17/615,558

(22) PCT Filed: Jan. 9, 2021

(86) PCT No.: PCT/CN2021/070986
§ 371 (c)(1),
(2) Date: Nov. 30, 2021

(87) PCT Pub. No.: WO2021/139800
PCT Pub. Date: Jul. 15, 2021

(65) Prior Publication Data
US 2022/0238831 A1 Jul. 28, 2022

(30) Foreign Application Priority Data
Jan. 9, 2020 (CN) .......................... 202010022585.2

(51) Int. Cl.
*H01L 51/50* (2006.01)
*H10K 50/11* (2023.01)
(Continued)

(52) U.S. Cl.
CPC ............. *H10K 50/11* (2023.02); *H10K 50/15* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2007/0009762 A1    1/2007   Hamada et al.
2007/0190355 A1*   8/2007   Ikeda ................... C07D 239/26
                                                           548/440
(Continued)

FOREIGN PATENT DOCUMENTS

CN            1893748 A    1/2007
CN          102239580 A   11/2011
(Continued)

OTHER PUBLICATIONS

The First Office Action of Priority Application No. CN 202010022585.2 issued by the Chinese Patent Office on Nov. 3, 2021.

*Primary Examiner* — Gregory D Clark
(74) *Attorney, Agent, or Firm* — XSENSUS LLP

(57) ABSTRACT

An organic light-emitting diode (OLED) device includes a first electrode, a light-emitting layer, an electron blocking layer and a second electrode. A material of the light-emitting layer includes a host material and a trap material. A lowest unoccupied molecular orbital energy level of the trap material is lower than a lowest unoccupied molecular orbital energy level of the host material, a highest occupied molecular orbital energy level of the trap type material is not higher than a highest occupied molecular orbital energy level of the host material, and the lowest unoccupied molecular orbital energy level of the trap material is lower than a lowest unoccupied molecular orbital energy level of the electron blocking layer. The first electrode, the light-emitting layer, the electron blocking layer and the second electrode are stacked in sequence.

20 Claims, 15 Drawing Sheets

(51) Int. Cl.
   *H10K 50/15*  (2023.01)
   *H10K 50/16*  (2023.01)
   *H10K 50/17*  (2023.01)
   *H10K 50/18*  (2023.01)
   *H10K 71/00*  (2023.01)
   *H10K 59/12*  (2023.01)
   *H10K 101/40* (2023.01)

(52) U.S. Cl.
   CPC ........... *H10K 50/18* (2023.02); *H10K 50/181* (2023.02); *H10K 71/00* (2023.02); *H10K 59/12* (2023.02); *H10K 2101/40* (2023.02)

(56) References Cited

U.S. PATENT DOCUMENTS

| | | |
|---|---|---|
| 2008/0074038 A1 | 3/2008 | Kim et al. |
| 2008/0122350 A1 | 5/2008 | Sakata et al. |
| 2011/0122633 A1* | 5/2011 | Han .................. H10K 59/8722 |
| | | 257/E33.056 |
| 2011/0175071 A1 | 7/2011 | Masui et al. |
| 2012/0037888 A1 | 2/2012 | Hunze et al. |
| 2013/0161590 A1* | 6/2013 | Yun ........................ H10K 50/11 |
| | | 257/E51.026 |
| 2015/0270315 A1 | 9/2015 | Takasu et al. |
| 2018/0033990 A1 | 2/2018 | Kim |

FOREIGN PATENT DOCUMENTS

| | | |
|---|---|---|
| CN | 103178212 A | 6/2013 |
| CN | 104934538 A | 9/2015 |
| CN | 107665952 A | 2/2018 |
| KR | 20190080558 A | 7/2019 |

\* cited by examiner

OLED DEVICE, DISPLAY APPARATUS AND MANUFACTURING METHOD THEREFOR

CROSS-REFERENCE TO RELATED APPLICATIONS

This application is a national phase entry under 35 USC 371 of International Patent Application No. PCT/CN2021/070986, filed on Jan. 9, 2021, which claims priority to Chinese Patent Application No. 202010022585.2, filed on Jan. 9, 2020, which are incorporated herein by reference in their entirety.

TECHNICAL FIELD

The present disclosure relates to the field of display technologies, and in particular, to an OLED device, a display apparatus and a manufacturing method therefor.

BACKGROUND

Organic light-emitting diode (OLED) display technology is a technology that uses organic semiconductor materials and light-emitting materials to emit light and achieve display under the drive of a current. In recent years, OLED display apparatuses have received more attention as a new type of flat panel displays, and they have become mainstream display products in the market due to their advantages of active luminescence, high luminance, high resolution, wide viewing angle, fast response speed, low energy consumption and flexibility.

SUMMARY

In a first aspect, an OLED device is provided. The OLED device includes a first electrode, a light-emitting layer, an electron blocking layer and a second electrode. A material of the light-emitting layer includes a host material and a trap material. A lowest unoccupied molecular orbital energy level of the trap material is lower than a lowest unoccupied molecular orbital energy level of the host material, a highest occupied molecular orbital energy level of the trap type material is not higher than a highest occupied molecular orbital energy level of the host material, and the lowest unoccupied molecular orbital energy level of the trap material is lower than a lowest unoccupied molecular orbital energy level of the electron blocking layer. The first electrode, the light-emitting layer, the electron blocking layer and the second electrode are stacked in sequence.

In some embodiments, the light-emitting layer includes at least one first sub-layer and at least one second sub-layer that are stacked; a material of the at least one first sub-layer includes the host material, a material of the at least one second sub-layer includes the trap material.

In some embodiments, of the at least one first sub-layer and the at least one second sub-layer, a sub-layer closest to the electron blocking layer is a first sub-layer.

In some embodiments, a thickness of the first sub-layer is greater than or equal to 50% of a thickness of the light-emitting layer.

In some embodiments, the material of the at least one second sub-layer further includes the host material, and the trap material is doped in the host material.

In some embodiments, the at least one first sub-layer includes one first sub-layer, and the at least one second sub-layer includes one second sub-layer.

In some embodiments, of the light-emitting layer, a mass ratio of the trap material to the host material is 3:7 to 7:3.

In some embodiments, a total number of the at least one first sub-layer and the at least one second sub-layer is greater than two, and the first sub-layer and the second sub-layer are alternately stacked.

In some embodiments, a thickness of each second sub-layer is 3% to 10% of a thickness of the light-emitting layer.

In some embodiments, each of the at least one first sub-layer and the at least one second sub-layer further includes a guest material.

In some embodiments, of the light-emitting layer, a mass ratio of the guest material to the host material is 1:100 to 15:100; and/or of the light-emitting layer, a mass ratio of the guest material to the trap material is 1:100 to 15:100.

In some embodiments, the trap material includes one of 4,4'-Di(9H-carbazol-9-yl)-biphenyl, 1,3,5-tri(9H-carbazol-9-yl)benzene (TCP), and 3,3-Di(9H-carbazol-9-yl)-1,1'-biphenyl (mCBP).

In some embodiments, the OLED device further includes a hole blocking layer disposed between the first electrode and the light-emitting layer.

In some embodiments, the OLED device further includes: an electron injection layer disposed between the first electrode and the hole blocking layer, an electron transport layer disposed between the electron injection layer and the hole blocking layer; a hole injection layer disposed between the second electrode layer and the electron blocking layer; and a hole transport layer disposed between the hole injection layer and the electron blocking layer.

In a second aspect, an OLED display apparatus is provided. The OLED display apparatus includes a plurality of OLED devices according to any one of the above embodiments.

In a third aspect, a manufacturing method for an organic light-emitting diode (OLED) device is provided. The method includes: forming a first electrode, a light-emitting layer, an electron blocking layer and a second electrode. The first electrode, the light-emitting layer, the electron blocking layer and the second electrode are stacked in sequence, and a material of the light-emitting layer includes a host material and a trap material. A lowest unoccupied molecular orbital energy level of the trap material is lower than a lowest unoccupied molecular orbital energy level of the host material, and a highest occupied molecular orbital energy level of the trap material is not higher than a highest occupied molecular orbital energy level of the host material.

In some embodiments, forming the first electrode, the light-emitting layer, the electron blocking layer, and the second electrode, includes: forming the first electrode, the light-emitting layer, the electron blocking layer, and the second electrode in sequence; or forming the second electrode, the electron blocking layer, the light-emitting layer, and the first electrode in sequence.

In some embodiments, the light-emitting layer includes at least one first sub-layer and at least one second sub-layer that are stacked. Forming the light-emitting layer includes: forming a first sub-layer of the at least one first sub-layer and forming a second sub-layer of the at least one second sub-layer. Forming the second sub-layer includes evaporating the host material. Forming the second sub-layer includes evaporating the host material and the trap material, simultaneously.

In some embodiments, the light-emitting layer includes at least one first sub-layer and at least one second sub-layer that are stacked. A total number of layers of the at least one first sub-layer and the at least one second sub-layer is greater than two, and the first sub-layer and the second sub-layer are alternately stacked. Forming the light-emitting layer includes: forming a first sub-layer of the at least one first sub-layer and forming a second sub-layer of the at least one second sub-layer. Forming the second sub-layer includes evaporating the host material. Forming the second sub-layer includes evaporating the trap material.

In some embodiments, the light-emitting layer further includes a guest material. Forming the first sub-layer further includes: evaporating the guest material while the host material is evaporated. Forming the second sub-layer further includes: evaporating the guest material while the trap material is evaporated.

In a fourth aspect, a manufacturing method for an organic light-emitting diode (OLED) display apparatus is provided. The method includes: providing a base; and manufacturing a plurality of OLED devices on the base. Each OLED device is manufactured by the method according to any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

REFERENCE CHARACTERS

Figure 1:
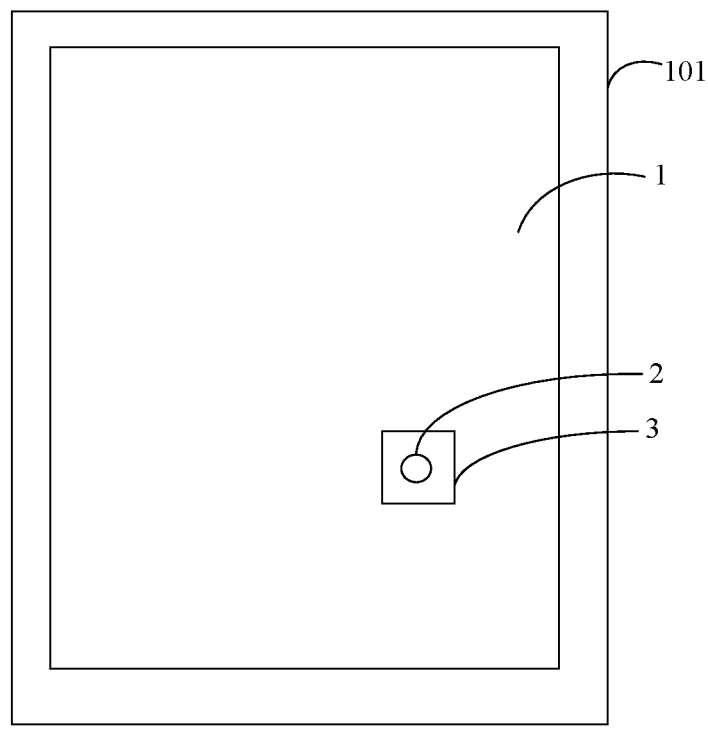
FIG. 1 is a schematic diagram illustrating a structure of an OLED display apparatus, in accordance with some embodiments.

100—Display apparatus; 101—Frame; 1—Display panel; 11—Base; 12—Planarization layer; 13—Pixel defining layer; 14—Encapsulation layer; 2—OLED device; 21—First electrode; 22—Hole blocking layer; 23—Light-emitting layer; 24—Electron blocking layer; 25—Second electrode; 26—Electron injection layer; 27—Electron transport layer; 28—Hole injection layer; 29—Hole transport layer; 231—First sub-layer; 232—Second sub-layer; 3—Pixel driving circuit; A—Display area; S—Peripheral area; P—Sub-pixel.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

It will be understood that, when a layer or an element is referred to as being on another layer or substrate, it may be directly on the another layer or substrate, or intervening layer(s) may also be present.

In the description of some embodiments, the terms "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

As used herein, depending on the context, the term "if" is optionally construed as "when" or "in a case where" or "in response to determining" or "in response to detecting." Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]," depending on the context.

The phrase "at least one of A, B and C" has a same meaning as the phrase "at least one of A, B or C," and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "configured to" in the embodiments of the present disclosure means an open and inclusive expression, which does not exclude devices configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thickness of layers and regions are enlarged for clarity. Exemplary embodiments of the present disclosure should not be construed to be limited to shapes of regions shown herein, but to include deviations in shape due to, for example, manufacturing. For example, an etched area shown as a rectangle generally has a curved feature. Therefore, the areas shown in the accompanying drawings are schematic in nature, and their shapes are not intended to show actual shapes of the area in a device, and are not intended to limit the scope of the exemplary embodiments.

Some embodiments of the present disclosure provide an organic light-emitting diode (OLED) display apparatus, the OLED display apparatus may serve as any product or component with a display function such as a display, a television, a digital camera, a mobile phone, a tablet computer, an augmented reality (AR) product or a virtual reality (VR) product, and a use of the OLED display apparatus is not limited in the embodiments of the present disclosure.

In some embodiments, as shown in FIG. 1, the OLED display apparatus 100 includes a display panel 1, a frame 101, a cover plate, a circuit board and the like. The OLED display apparatus may include more or fewer components, and relative positions of these components may be changed. For example, the display panel 1 and the circuit board are provided in a cavity enclosed by the frame 101 and the cover plate.

In some examples, the circuit board is configured to provide the display panel 1 with signals required for display. For example, the circuit board is a printed circuit board assembly (PCBA). The PCBA includes a printed circuit board (PCB), a timing controller (TCON) disposed on the PCB, a power management integrated circuit (PMIC), and other integrated circuits (ICs) or circuitry.

Figure 2A:
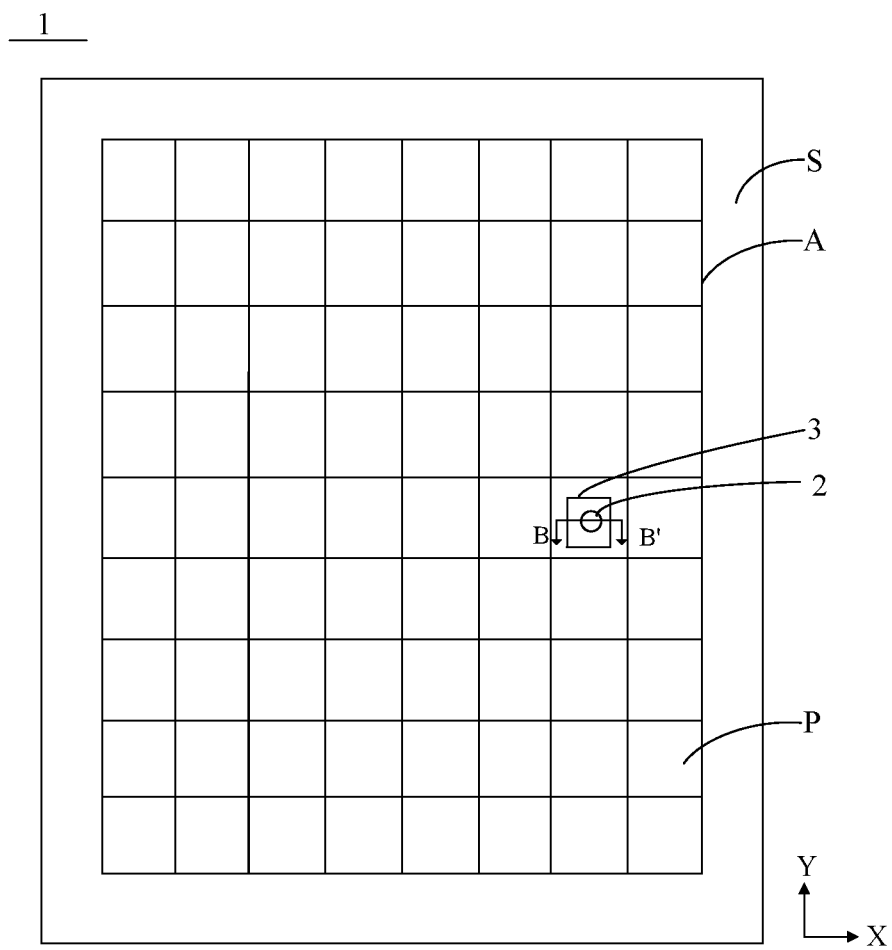
FIG. 2A is a schematic diagram illustrating a structure of a display panel, in accordance with some embodiments.

As shown in FIG. 2A, the display panel 1 has a display area A and a peripheral region S located on at least one side of the display area A. In some examples, the peripheral area S is arranged around the display area A. In some other examples, the peripheral area S is located on only one side of the display area A. In yet some other examples, the peripheral area S is located on two opposite sides of the display area A. The peripheral area S is used for wiring, in addition, a driver circuit (e.g., a gate driver circuit) may also be provided in the peripheral area S. FIG. 2A shows an example in which the peripheral area S is arranged around the display area A.

As shown in FIG. 2A, the display panel 2 includes a plurality of sub-pixels P disposed in the display area A. FIG. 2A shows an example in which the plurality of sub-pixels P are arranged in a matrix with a plurality of rows and a plurality of columns. Herein, sub-pixels P arranged in a line in an X direction are referred to as sub-pixels in a row, and sub-pixels P arranged in a line in a Y direction are referred to as sub-pixels in a column.

In some embodiments, the plurality of sub-pixels P include at least sub-pixels of a first color, sub-pixels of a second color, and sub-pixels of a third color. For example, the first color sub-pixels, the second color sub-pixels, and the third color sub-pixels are red sub-pixels, green sub-pixels, and blue sub-pixels, respectively. A distribution of the first color sub-pixels, the second color sub-pixels, and the third color sub-pixels is, for example, that first color sub-pixels, second color sub-pixels, and third color sub-pixels in sub-pixels in each row are alternately arranged in sequence.

Figure 2B:
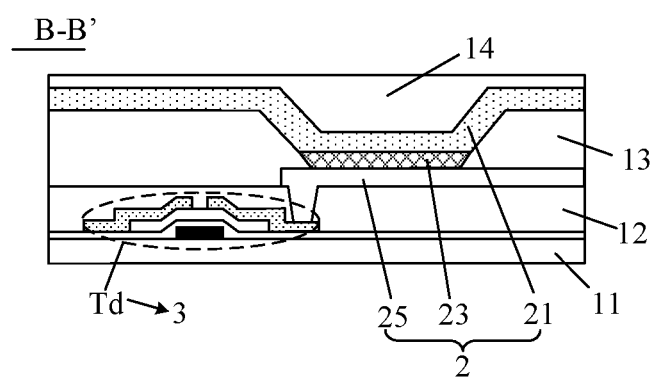
FIG. 2B is a sectional view taken along the B-B' line in FIG. 2A, in accordance with some embodiments.

As shown in FIGS. 2A and 2B, the display panel 1 includes a base 11. Each sub-pixel P includes an OLED device 2 disposed on the base 11 and a pixel driving circuit 3 electrically connected to the OLED device 2.

In some examples, the base 11 may be a flexible base or a rigid base. A material of the flexible base is, for example, polyimide. A material of the rigid base is, for example, glass.

In some examples, as shown in FIG. 2B, the display panel 1 further includes a pixel defining layer 13. The pixel defining layer 13 includes a plurality of openings, and one OLED device is disposed in one opening.

Figure 3A:
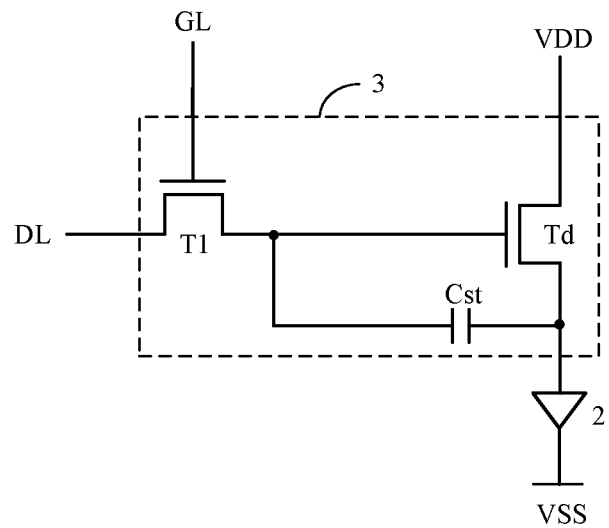
FIG. 3A is a circuit diagram of a pixel driving circuit, in accordance with some embodiments.

In some examples, as shown in FIG. 3A, the pixel driving circuit 3 includes a driving transistor Td, a first switching transistor T1 and a storage capacitor Cst. That is, a circuit structure of the pixel driving circuit 3 is a 2T1C circuit structure. It will be understood by those skilled in the art that in the pixel driving circuit 3, a width-length ratio of a channel of the driving transistor Td is greater than width-length ratios of channels of other transistors that function as switches.

As shown in FIG. 3A, a gate of the first switching transistor T1 is electrically connected to a scanning signal line GL, a first electrode of the first switching transistor T1 is electrically connected to a data signal line DL, and a second electrode of the first switching transistor T1 is electrically connected to a gate of the driving transistor Td. A first electrode of the driving transistor Td is electrically connected to a first power line VDD, and a second electrode of the driving transistor Td is electrically connected to an anode of the OLED device 2. A cathode of the OLED device 2 is electrically connected to a second power line VSS. A terminal of the storage capacitor Cst is electrically connected to the gate of the driving transistor Td, and the other terminal of the storage capacitor Cst is electrically connected to the second electrode of the driving transistor Td. For example, the first power line VDD is configured to provide a high voltage signal, and the second power line VSS is configured to provide a low voltage signal.

Figure 3B:
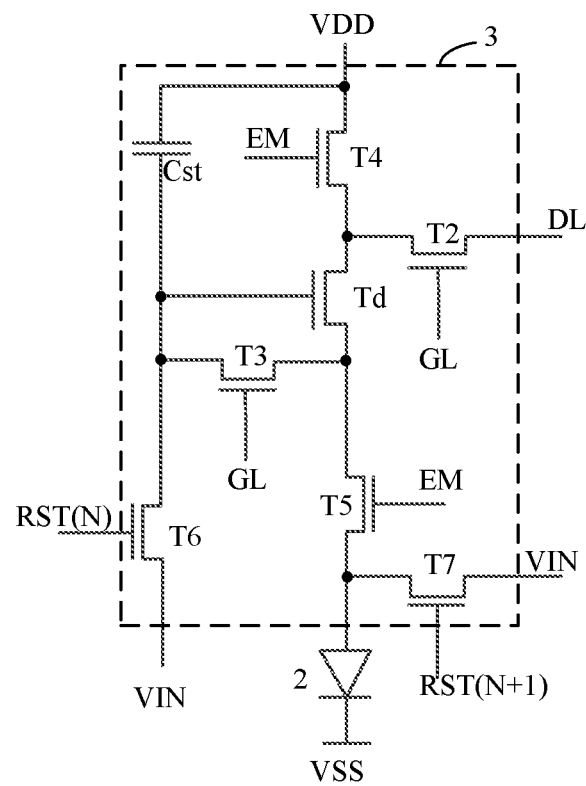
FIG. 3B is a circuit diagram of another pixel driving circuit, in accordance with some embodiments.

In some other examples, as shown in FIG. 3B, the pixel driving circuit 3 includes a driving transistor Td, a second switching transistor T2, a third switching transistor T3, a fourth switching transistor T4, a fifth switching transistor T5, a sixth switching transistor T6, a seventh switching transistor T7 and a storage capacitor Cst. That is, the circuit structure of the pixel driving circuit 3 is a 7T1C circuit structure.

As shown in FIG. 3B, a gate of the second switching transistor T2 is electrically connected to a scanning signal line GL, a first electrode of the second switching transistor T2 is electrically connected to a data signal line DL, and a second electrode of the second switching transistor T2 is electrically connected to a gate of the driving transistor Td. A gate of the third switching transistor T3 is electrically connected to the scanning signal line GL, and a first electrode and a second electrode of the third switching transistor T3 are electrically connected to a second electrode and a gate of the driving transistor Td, respectively. A gate of the fourth switching transistor T4 is electrically connected to an enable signal line EM, a first electrode of the fourth switching transistor T4 is electrically connected to a first power line VDD, and a second electrode of the fourth switching transistor T4 is electrically connected to the first electrode of the driving transistor Td. A gate of the fifth switching transistor T5 is electrically connected to the enable signal line EM, a first electrode of the fifth switching transistor T5 is electrically connected to the second electrode of the driving transistor Td, and a second electrode of the fifth switching transistor T5 is electrically connected to an anode of the OLED device 2. A gate of the sixth switching transistor T6 is electrically connected to a reset signal line RST(N), a first electrode of the sixth switching transistor T6 is electrically connected to an initialization signal line VIN, and a second electrode of the sixth switching transistor T4 is electrically connected to the gate of the driving transistor Td. A gate of the seventh switching transistor T7 is electrically connected to a reset signal line RST(N+1) that is connected to a sixth switching transistor T6 of a pixel driving circuit 3 in a next row, a first electrode of the seventh switching transistor T7 is electrically connected to the initialization signal line VIN, and a second electrode of the seventh switching transistor T7 is electrically connected to the anode of the OLED device 2. A terminal of the storage capacitor Cst is electrically connected to the gate of the driving transistor Td, and the other terminal of the storage capacitor Cst is electrically connected to the first power line VDD. A cathode of the OLED device 2 is electrically connected to a second power line VSS. For example, the first power line VDD is configured to provide a high voltage signal, and the second power line VSS is configured to provide a low voltage signal.

The above is merely examples for the pixel driving circuit 3. The circuit structure of the pixel driving circuit 3 is not limited to the two structures described above, and may be other types of circuit structure, which will not be listed herein. However, it will be understood that, regardless of which circuit structure the pixel driving circuit 3 has, it includes at least a driving transistor, a switching transistor function as a switch, and a storage capacitor.

Transistors used in the embodiments of the present disclosure may all be thin film transistors or field-effect transistors or other devices with same characteristics. In the embodiments of the present disclosure, a first electrode is one of a source and a drain of a transistor, and a second electrode is the other of the source and the drain of the transistor. Since the source and the drain of the transistor may be symmetrical in structure, there may be no difference in structure between the source and the drain of the transistor. That is, there may be no difference in structures between the first electrode and the second electrode of the transistor in the embodiments of the present disclosure. For example, for a P-type transistor, the second electrode is referred to as the drain, and the first electrode is referred to as the source. For another example, for an N-type transistor, the first electrode is referred to as the drain, and the second electrode is referred to as the source.

In some examples, as shown in FIG. 2B, the display panel 1 further includes a planarization layer 12 disposed between the pixel driving circuit 3 and an OLED device 2 corresponding thereto, and the driving transistor Td is electrically connected to a second electrode 25 (e.g., the anode) of the OLED device 2 through a via hole disposed in the planarization layer 12. For example, the planarization layer 12 may be formed by forming an insulating film through a chemical vapor deposition after the pixel driving circuit 3 is formed, and then the required via hole may be formed by performing a patterning process on the insulating film.

For example, a material of the planarization layer 12 includes, but is not limited to, a polysiloxane-based material, an acrylic-based material or a polyimide-based material.

In some examples, as shown in FIG. 2B, the display panel 1 further includes an encapsulation layer 14.

Figure 4A:
FIG. 4A is a schematic diagram illustrating a structure of an OLED device, in accordance with some embodiments.

As shown in FIG. 4A, some embodiments of the present disclosure provide an OLED device 2 including a first electrode 21, a light-emitting layer (EML) 23, an electron blocking layer (EBL) 24 and a second electrode 25 that are stacked in sequence. For example, a thickness of the light-emitting layer 23 is in a range of 20 nm to 40 nm. For example, a thickness of the electron blocking layer 24 is in a range of 5 nm to 10 nm.

Figure 4B:
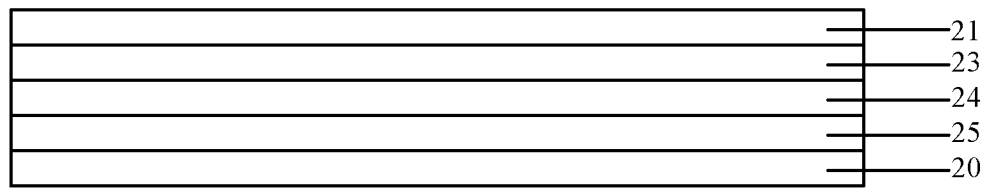
FIG. 4B is a schematic diagram illustrating a structure of another OLED device, in accordance with some embodiments.
Figure 4C:
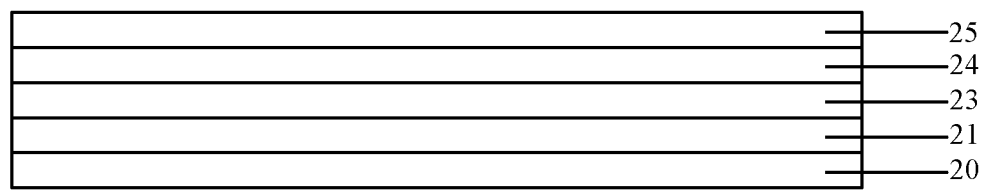
FIG. 4C is a schematic diagram illustrating a structure of yet another OLED device, in accordance with some embodiments.
Figure 5:
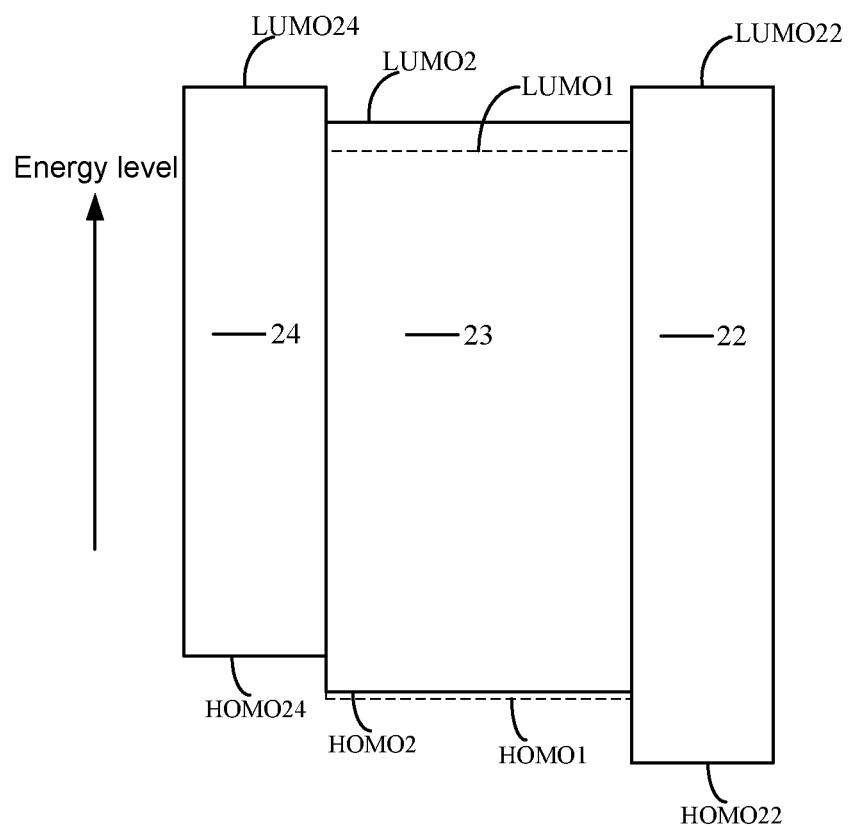
FIG. 5 is a schematic diagram illustrating a relationship of energy levels of materials of an EBL, an EML, and an HBL in an OLED device, in accordance with some embodiments.
Figure 6:
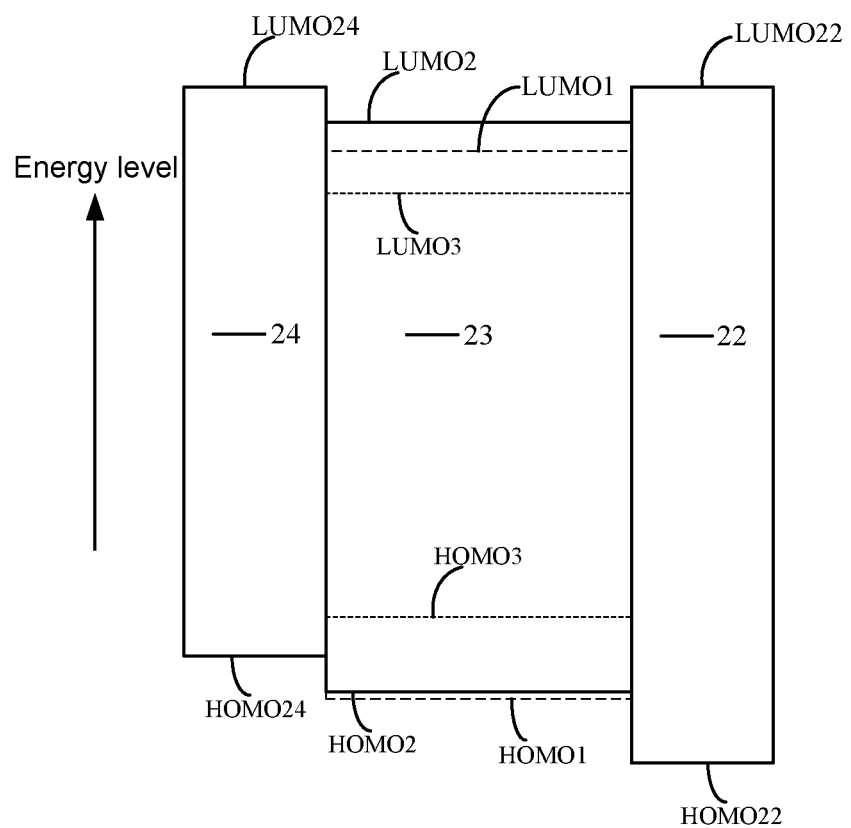
FIG. 6 is a schematic diagram illustrating a relationship of energy levels of materials of an EBL, an EML, and an HBL in another OLED device, in accordance with some embodiments.
Figure 7:
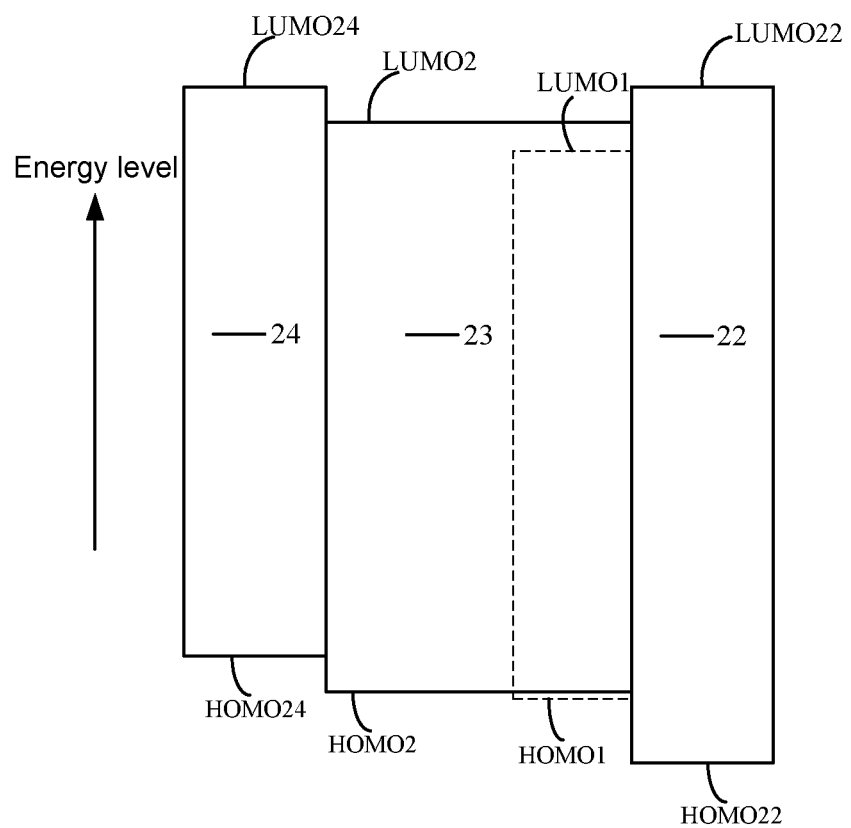
FIG. 7 is a schematic diagram illustrating a relationship of energy levels of materials of an EBL, an EML, and an HBL in yet another OLED device, in accordance with some embodiments.

In some examples, as shown in FIGS. 4B and 4C, the OLED device 2 is formed on a substrate 20. "being stacked"

means that the above are stacked in a thickness direction of the substrate 20. For example, as shown in FIG. 4B, the second electrode 25, the electron blocking layer 24, the light-emitting layer 23 and the first electrode 21 are sequentially stacked on the substrate 20 in the thickness direction of the substrate 20. For another example, as shown in FIG. 4C, the first electrode 21, the light-emitting layer 23, the electron blocking layer 24 and the second electrode 25 are sequentially stacked on the substrate 20 in the thickness direction of the substrate 20.

For example, a material of the substrate 20 is glass. For another example, the material of the substrate 20 is polyimide.

In some examples, the OLED device is applied to the display panel 1, and the substrate 20 for the OLED device is the base in the display panel 1.

In some examples, the first electrode 21 is a cathode and the second electrode 25 is an anode. Holes injected through the second electrode 25 and electrons injected through the first electrode 21 both move to the light-emitting layer 23 due to an action of an electric field, and the holes and the electrons recombine in the light-emitting layer 23 to form excitons. The excitons activate organic molecules in the light-emitting layer, which in turn makes electrons in the outermost layer of the organic molecules jump to an excited state from a ground state. Since the electrons in the excited state are extremely unstable and may return to the ground state, and energy may be released in a form of light during the transition process, the luminescence of the OLED device is achieved.

In some examples, as shown in FIG. 4B, the second electrode 25 is disposed on the substrate 20, and the first electrode 21 is disposed on a side of the second electrode 25 away from the substrate 20.

For example, in a case where the OLED device has a top-emission structure, the first electrode 21 is a transparent electrode or a translucent electrode, and the second electrode 25 is a translucent electrode or a reflective electrode. For example, the first electrode 21 is a transparent electrode, and a material of the first electrode 21 includes indium tin oxide (ITO), indium zinc oxide (IZO), tin oxide ($SnO_2$), zinc oxide (ZnO) or any combination thereof. Alternatively, the first electrode 21 is a translucent electrode, and the material of the first electrode 21 includes $SnO_2$, ITO, IZO, ZnO, indium oxide ($In_2O_3$), indium gallium oxide (IGO), aluminum oxide zinc (AZO) or any combination thereof. The second electrode 25 is a reflective electrode, and a material of the second electrode 25 includes magnesium (Mg), silver (Ag), aluminum (Al), aluminum-lithium (Al—Li), calcium (Ca), magnesium-indium (Mg—In), magnesium-silver (Mg—Ag) or a combination thereof. The embodiments of the present disclosure are not limited thereto.

For example, in a case where the OLED device has a bottom-emission structure, the first electrode 21 is a translucent electrode or a reflective electrode, and the second electrode 25 is a transparent electrode or a translucent electrode. For example, the first electrode 21 is a reflective electrode, and a material of the first electrode 21 includes Mg, Ag, Al, Al—Li, Ca, Mg—In, Mg—Ag or a combination thereof. The embodiments of the present disclosure are not limited thereto. The second electrode 25 is a transparent electrode, and the material of the second electrode 25 includes ITO, IZO, $SnO_2$, ZnO or any combination thereof. Alternatively, the second electrode 25 is a translucent electrode, and the material of the first electrode 25 includes $SnO_2$, ITO, IZO, ZnO, $In_2O_3$, IGO, AZO or any combination thereof. The embodiments of the present disclosure are not limited thereto.

A material of the light-emitting layer 23 includes a host material and a trap material. As shown in FIGS. 5 to 12, a lowest unoccupied molecular orbital (LUMO) energy level LUMO1 of the trap material is lower than a lowest unoccupied molecular orbital energy level LUMO2 of a host material, and the lowest unoccupied molecular orbital energy level LUMO1 of the trap material is lower than a lowest unoccupied molecular orbital energy level LUMO24 of a material of the electron blocking layer 24. A highest occupied molecular orbital (HOMO) energy level HOMO1 of the trap type material is not higher than a highest occupied molecular orbital energy level HOMO2 of the host material. The host material of the light-emitting layer 23 has a property of transporting carriers, and the trap material has a property of trapping electrons.

In some examples, as shown in FIGS. 5 to 12, the lowest unoccupied molecular orbital energy level LUMO2 of the host material is lower than the lowest unoccupied molecular orbital energy level LUMO24 of the material of the electron blocking layer 24. In this way, the electron blocking layer 24 blocks electrons from the cathode at an interface between the light-emitting layer 23 and the electron blocking layer 24 of the OLED device, so that a concentration of electrons at the interface between the light-emitting layer 23 and the electron blocking layer 24 of the OLED device is increased.

In some other examples, as shown in FIGS. 5 to 12, the highest occupied molecular orbital energy level HOMO2 of the host material is lower than a highest occupied molecular orbital energy level HOMO24 of the material of the electron blocking layer 24.

In some examples, the host material of the light-emitting layer 23 includes one of 4,4',4"-Tris(carbazol-9-yl)-triphenylamine (TCTA), N,N'-Dimethylquinacridone (DMQA) and 3,3'-(1,3-phenyl)-Bis(7-ethoxy-4-methyl-3-coumarinyl) benzene (mEMCB). The embodiments of the present disclosure are not limited thereto.

In some examples, the trap material of the light-emitting layer 23 includes one of 4,4'-Di(9H-carbazol-9-yl)-biphenyl (CBP), 1,3,5-tri(9H-carbazol-9-yl)benzene (TCP) and 3,3-Di(9H-carbazol-9-yl)-1,1'-biphenyl (mCBP). The embodiments of the present disclosure are not limited thereto, as long as it is ensured that the lowest unoccupied molecular orbital energy level LUMO1 of the trap material is lower than the lowest unoccupied molecular orbital energy level LUMO2 of the host material, and the highest occupied molecular orbital energy level HOMO1 of the trap material is not higher than the highest occupied molecular orbital energy level HOMO2 of the host material.

In some examples, the material of the electron blocking layer 24 includes one of mCBP and 3,6-Bis(N-phenyloxazol-3-yl)-N-phenylcarbazole (Tris-PCz). The embodiments of the present disclosure are not limited thereto, as long as it is ensured that the lowest unoccupied molecular orbital energy level LUMO1 of the trap material is lower than the lowest unoccupied molecular orbital energy level LUMO24 of the material of the electron blocking layer 24, and the highest occupied molecular orbital energy level HOMO1 of the trap material is lower than the highest occupied molecular orbital energy level HOMO24 of the material of the electron blocking layer 24. It is understood that, in a case where the trap material of the light-emitting layer 23 is mCBP, the material of the electron blocking layer 24 is not mCBP.

Figure 13:
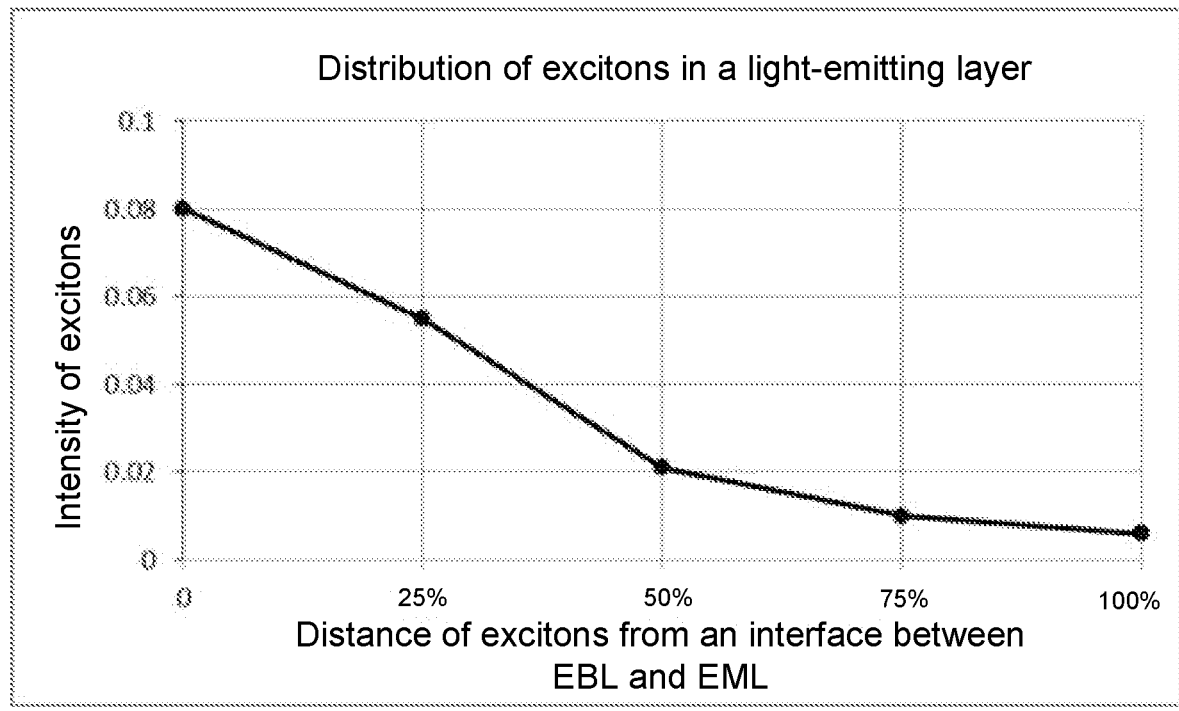
FIG. 13 is a distribution diagram of excitons in a light-emitting layer of an OLED device in the prior art.
Figure 14:
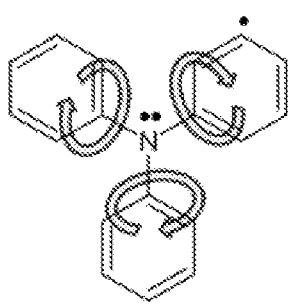
FIG. 14 is a schematic diagram of the twisting of bonds in the material of an EBL.

As shown in FIG. 13, electrons and holes recombine to form more excitons in a region proximate to an electron blocking layer (EBL) 24 of a light-emitting layer (EML) 23 of an OLED device. That is to say, transmission of the electrons in the OLED device is excessive, and the electrons are easier to be transmitted and accumulated at an interface of the EML and EBL. Since a material of the EBL is generally an electron-rich material and contains a structure of aniline, if too many electrons accumulate at the interface between the EML and the EBL, these electrons may generate a repulsive force with surplus electrons in the material of the EBL, and this repulsive force may distort a δ-bond of a benzene ring of aniline in the material of the EBL (as shown in FIG. 14). The distortion of the δ-bond may cause the δ-bond to break, and a defect caused by the breaking of the δ-bond may cause the material of the EBL to deteriorate, and further causing a service life of the OLED device to decrease. Reduction of the service life of the OLED device may cause a white balance shift of a product having the display panel after long-term use, and a color of the white picture may be reddish, greenish or pinkish visually.

In the OLED device 2 provided by the embodiments of the present disclosure, the material of the light-emitting layer 23 includes the trap material and the host material. The LUMO energy level of the trap material is lower than the LUMO energy level of the host material, and the HOMO energy level of the trap material is not higher than HOMO energy level of the host material. In this way, the electrons injected from the cathode may be trapped by the trap material of the light-emitting layer 23, and the holes injected from the anode may not be trapped by the trap material of the light-emitting layer 23. Therefore, under the premise of ensuring a luminous efficiency of the OLED device, a case where excessive electrons are transmitted and accumulated at an interface of the EML and the EBL may be reduced.

Therefore, in the embodiments of the present disclosure, the trap material is added to the material of the light-emitting layer 23 to trap excessive electrons, thereby avoiding the accumulation of excessive electrons at the interface between the EML and the EBL, reducing the deterioration of the material of the EBL, improving stability of the material of the EBL, and prolonging the service life of the OLED device.

In some embodiments, as shown in FIGS. 8 to 12, the light-emitting layer 23 includes at least one first sub-layer 231 and at least one second sub-layer 232 that are stacked. A material of the at least one first sub-layer 231 includes the host material, and a material of at least one second sub-layer 232 includes the trap material.

In some embodiments, as shown in FIGS. 8 to 12, of the at least one first sub-layer 231 and the at least one second sub-layer 232, a sub-layer closest to the electron blocking layer 24 is a first sub-layer 231. In this way, in the light-emitting layer 23, compared to the first sub-layer 231 closest to the electron blocking layer 24, the material of the second sub-layer 232 away from the electron blocking layer 24 includes the trap material that can trap electrons, so that electrons transmitted to the interface between the EML and the EBL may be reduced, so as to prevent excessive electrons from accumulating at the interface between the EML and EBL.

In some embodiments, as shown in FIGS. 8 to 12, a thickness of the first sub-layer 231 closest to the electron blocking layer 24 is greater than or equal to 50% of a thickness of the light-emitting layer 23.

As shown in FIG. 13, in the light-emitting layer 23 and in a thickness direction of the light-emitting layer 23, in a region with a distance to the interface between the EML and the EBL greater than 50% of the thickness of the light-emitting layer 23, intensity of excitons formed by recombination of electrons and holes is small. Therefore, the thickness of the first sub-layer 231 closest to the electron blocking layer 24 is greater than or equal to 50% of the thickness of the light-emitting layer 23. That is to say, the second sub-layer 232 is located in the region with the distance to the interface between the EML and the EBL greater than 50% of the thickness of the light-emitting layer 23. In this way, the trap material of the second sublayer 232 traps electrons, which has a small influence on the intensity of excitons in the EML, thereby ensuring the luminous intensity of the OLED device 2.

Figure 8:
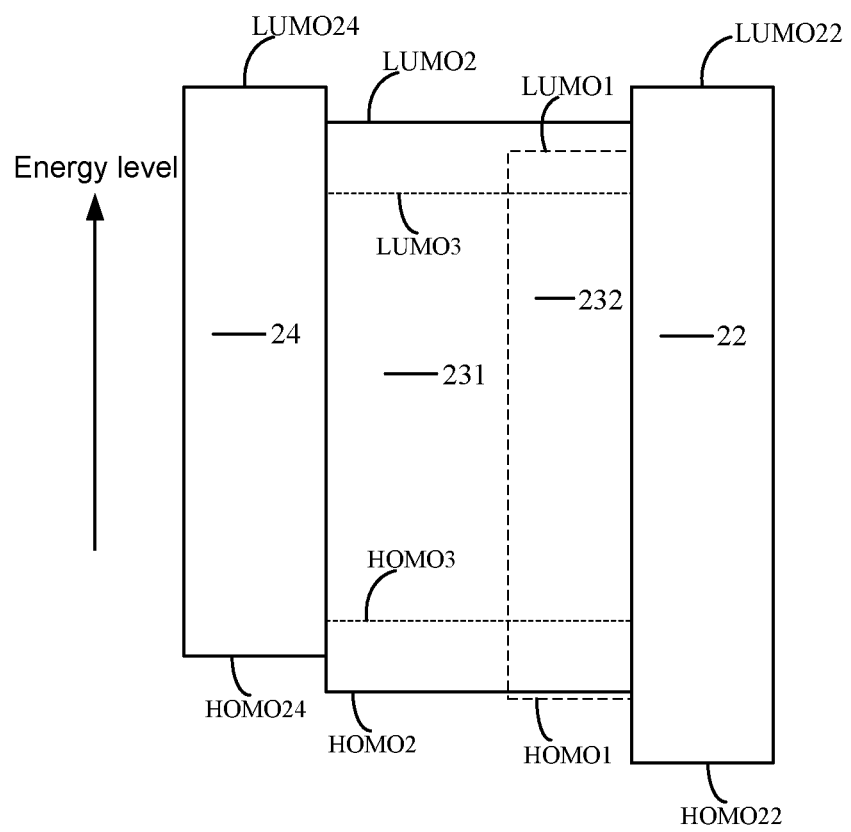
FIG. 8 is a schematic diagram illustrating yet another relationship of energy levels of materials of an EBL, an EML, and an HBL in yet another OLED device, in accordance with some embodiments.

In some examples, as shown in FIG. 8, the material of the at least one second sub-layer 232 further includes the host material, and the trap material is doped in the host material.

Figure 9:
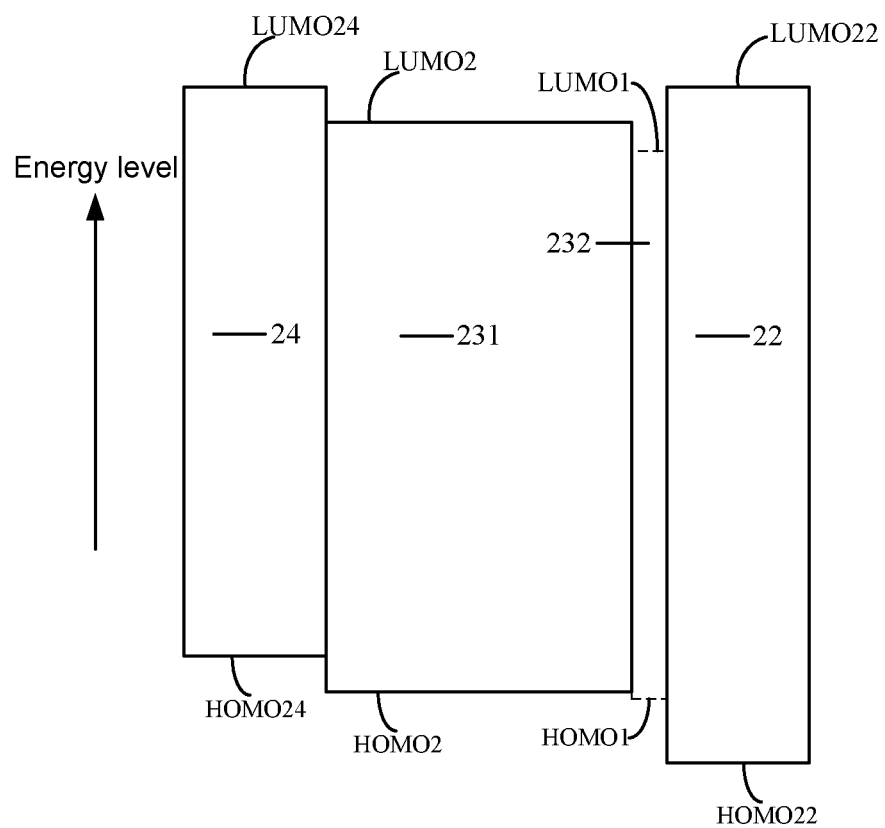
FIG. 9 is a schematic diagram illustrating a relationship of energy levels of materials of an EBL, an EML, and an HBL in yet another OLED device, in accordance with some embodiments.
Figure 10:
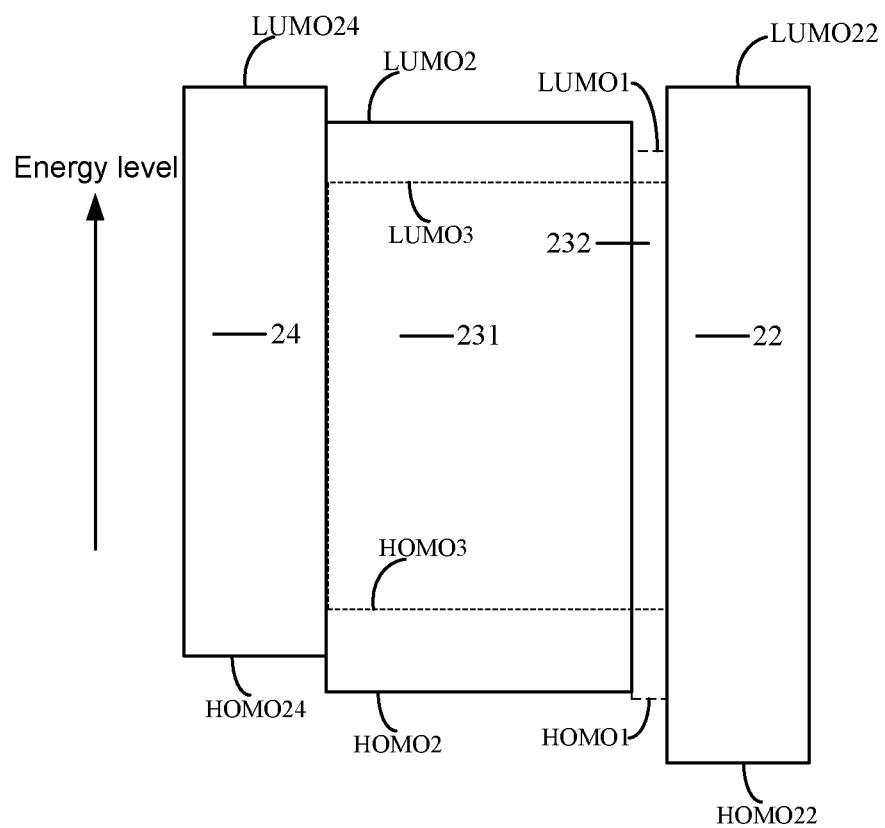
FIG. 10 is a schematic diagram illustrating a relationship of energy levels of materials of an EBL, an EML, and an HBL in yet another OLED device, in accordance with some embodiments.

For example, as shown in FIGS. 8 to 10, the light-emitting layer 23 includes one first sub-layer 231 and one second sub-layer 232. For example, a thickness of the second sub-layer 232 is in a range of 10 nm to 20 nm.

For another example, the light-emitting layer 23 may also include a plurality of first sub-layers 231 and a plurality of second sub-layers 232, which are not limited in the embodiments of the present disclosure.

For example, of the light-emitting layer 23, a mass ratio of a total mass of the trap material to a total mass of the host material is 3:7 to 7:3.

Figure 11:
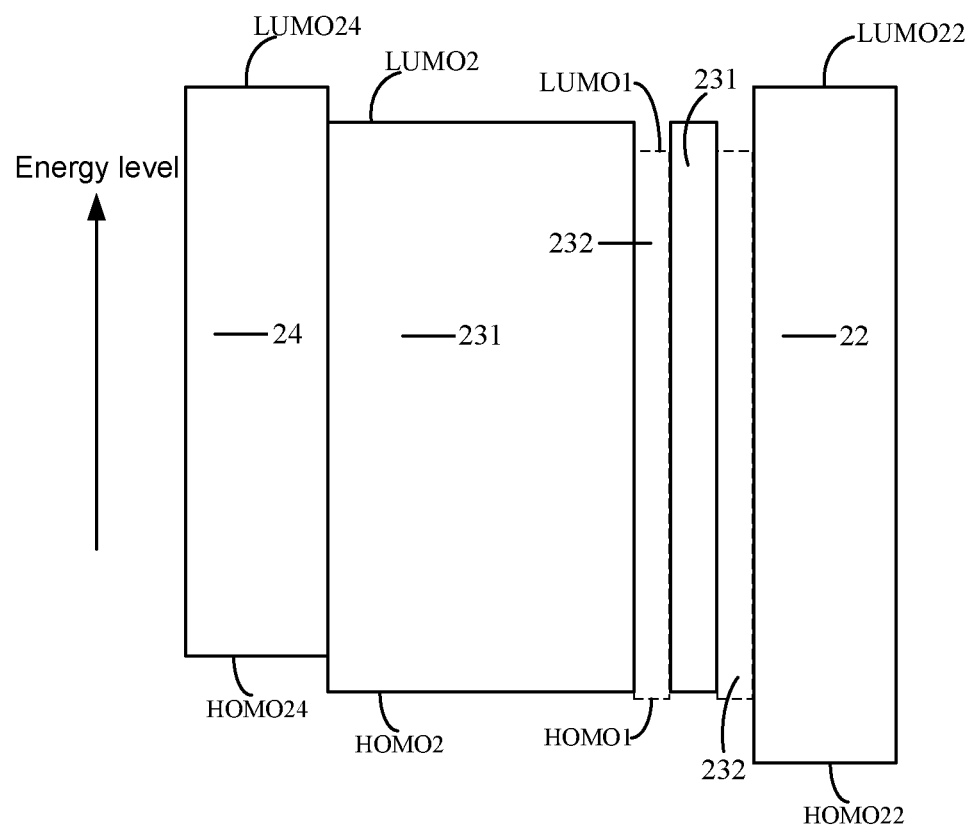
FIG. 11 is a schematic diagram illustrating a relationship of energy levels of materials of an EBL, an EML, and an HBL in yet another OLED device, in accordance with some embodiments.
Figure 12:
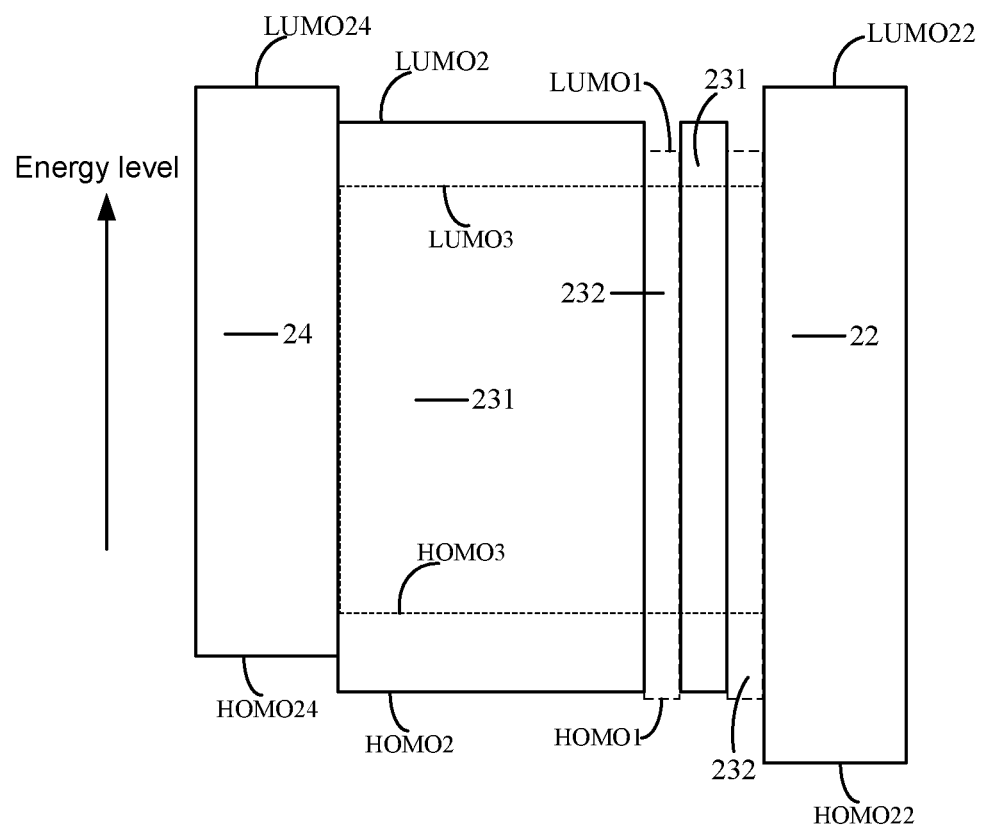
FIG. 12 is a schematic diagram illustrating a relationship of energy levels of materials of an EBL, an EML, and an HBL in yet another OLED device, in accordance with some embodiments.

In some examples, as shown in FIGS. 11 and 12, a total number of the at least one first sub-layer 231 and the at least one second sub-layer 232 is greater than two, and the first sub-layer 231 and the second sub-layer 232 are alternately stacked.

For example, the light-emitting layer 23 includes two or three second sub-layers. For example, as shown in FIGS. 11 and 12, the light-emitting layer 23 includes two first sub-layers 231 and two second sub-layers 232, and the first sub-layers 231 and the second sub-layers 232 are alternately stacked in the thickness direction of the light-emitting layer 23. A sub-layer closest to the electron blocking layer 24 is a first sub-layer 231, and the thickness of the first sub-layer is greater than 50% of the thickness of the light-emitting layer 23.

For example, a thickness of each second sub-layer 232 is 3% to 10% of the thickness of the light-emitting layer 23.

In the case where the light-emitting layer 23 includes a plurality of second sub-layers 232, thicknesses of the plurality of second sub-layers 232 may be exactly equal, for example, the thicknesses of the plurality of second sub-layers 232 are each 5% of the thickness of the light-emitting layer 23. The thicknesses of the plurality of second sub-layers 232 may not be exactly equal. Herein, "not exactly equal" means that part are equal and part are not equal; or all are not equal. The embodiments of the present disclosure do not limit thereto, as long as the thickness of the first sub-layer 231 in the light-emitting layer 23 closest to the electron blocking layer 24 is greater than or equal to 50% of the thickness of the light-emitting layer 23.

In some embodiments, as shown in FIGS. 6, 8,10 and 12, the material of the light-emitting layer 23 further includes a guest material. The guest material of the light-emitting layer 23 receives energy of the host material to achieve light emission, thereby ensuring the luminous efficiency of the OLED device.

In some embodiments, as shown in FIGS. 8, 10, and 12, the material of each first sub-layer 231 and the material of each second sub-layer 232 in the light-emitting layer 23 further includes the guest material.

In some examples, of the light-emitting layer 23, a mass ratio of a total mass of the guest material to a total mass of the host material is 1:100 to 15:100.

In some other examples, of the light-emitting layer 23, a mass ratio of the total mass of the guest material to a total mass of the trap material is 1:100 to 15:100.

For example, the guest material includes Tris(2-phenylpyridine)iridium (Ir(ppy)$_3$) and Bis[2-(2-hydroxyphenyl)-pyridine]beryllium (Be(PP)$_2$).

In some examples, a relationship of energy levels of the host material, the trap material and the guest material is shown in FIGS. 6, 8, 10 and 12, a lowest unoccupied molecular orbital energy level HOMO3 of the guest material is lower than the lowest unoccupied molecular orbital energy level LUMO1 of the trap material, and a highest occupied molecular orbital energy level HOMO3 of the guest material is higher than the highest occupied molecular orbital energy level HOMO2 of the host material.

Figure 15A:
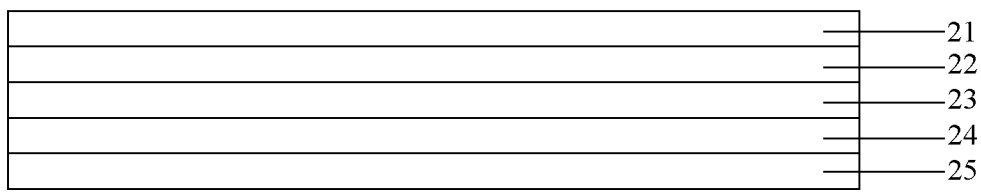
FIG. 15A is a schematic diagram illustrating a structure of yet another OLED device, in accordance with some embodiments.

In some embodiments, as shown in FIG. 15A, the OLED device 2 further includes a hole blocking layer (HBL) 22 disposed between the first electrode 21 and the light-emitting layer 23. For example, a thickness of the HBL 22 is in a range of 10 nm to 80 nm.

In some examples, as shown in FIGS. 5 to 12, the lowest unoccupied molecular orbital energy level LUMO2 of the host material is lower than a lowest unoccupied molecular orbital energy level LUMO22 of a material of the HBL 22. The highest occupied molecular orbital energy level HOMO2 of the host material is higher than a highest occupied molecular orbital energy level HOMO22 of the material of the hole blocking layer 22. In this way, the hole blocking layer 22 blocks holes from the anode at an interface between the light-emitting layer 23 and the hole blocking layer 22 of the OLED device, so that a recombination probability of electrons and holes in the light-emitting layer of the OLED device is improved, and the luminous efficiency of the OLED device is increased.

For example, the material of the hole blocking layer 22 includes one of 2,9-Dimethyl-4,7-diphenyl-1,10-phenanthroline (BCP), 1,10-Phenanthroline (Bphen) and 1,3,5-Tris(1-phenyl-1H-benzimidazol-2-yl)benzene (TPBI). The embodiments of the present disclosure are not limited thereto.

Figure 15B:
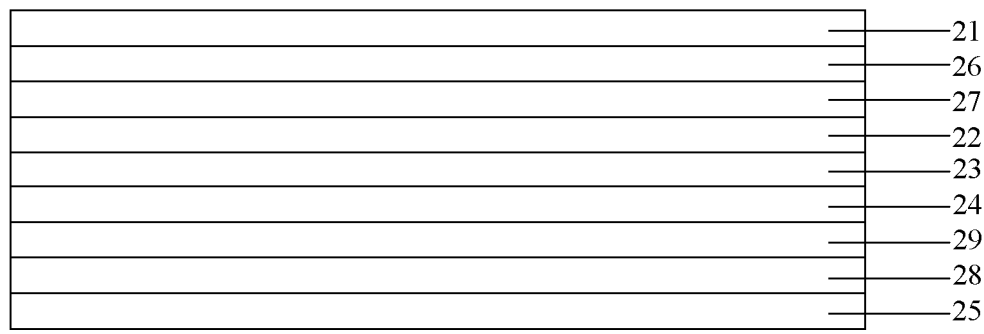
FIG. 15B is a schematic diagram illustrating a structure of yet another OLED device, in accordance with some embodiments.

In some embodiments, as shown in FIG. 15B, the OLED device 2 further includes an electron injection layer (EIL) 26, an electron transport layer (ETL) 27, and a hole injection layer (HIL) 28 and a hole transport layer (HTL) 29.

The electron injection layer 26 is located between the first electrode 21 (e.g., the cathode) and the hole blocking layer 22. The electron injection layer 26 modifies the cathode, and transmits electrons to the electron transport layer 27, so that a speed and amount of electron injection from the first electrode 21 may be adjusted. For example, a thickness of the electron injection layer 26 is in a range of 1 nm to 3 nm.

For example, a material of the electron injection layer 26 includes one of lithium fluoride (LiF), ytterbium (Yb) and quinolinolato lithium (8-hydroxy-quinolinolato lithium (LIQ)) complex. The embodiments of the present disclosure do not limit thereto.

The electron transport layer 27 is located between the electron injection layer 26 and the hole blocking layer 22, and transports electrons from the cathode to the light-emitting layer 23 of the OLED device. For example, a thickness of the electron transport layer 27 is in a range of 20 nm to 35 nm.

For example, a material of the electron transport layer 27 includes one of BCP, Bphen, and TPBI. For example, the materials of the electron transport layer 27 and the hole blocking layer 22 are the same. For another example, the materials of the electron transport layer 27 and the hole blocking layer 22 are different. The embodiments of the present disclosure are not limited thereto.

The hole injection layer 28 is located between the second electrode 25 (e.g. the anode) and the electron blocking layer 24. The hole injection layer 28 modifies the anode of the OLED device, so that holes from the anode may be smoothly injected into the hole transport layer 29, and an injection rate and amount of the holes from the second electrode 25 may be adjusted. For example, a thickness of the hole transport layer 29 is in a range of 5 nm to 30 nm.

For example, a material of the hole injection layer 28 includes one of molybdenum trioxide (MoO$_3$), 2,3,5,6-Tetrafluoro-7,7,8,8-tetracyanoquinodimethane (F4TCNQ) and 2,3,6,7,10,11-hexacyano-1,4,5,8,9,12-hexaazatriphenylene (HAT-CN). However, the embodiments of the present disclosure are not limited thereto.

The hole transport layer 29 is located between the hole injection layer 28 and the electron blocking layer 24, and transports holes to the light-emitting layer 23. For example, a thickness of the hole transport layer 29 is in a range of 1000 nm to 1300 nm.

A material of the hole transport layer 29 includes at least one of N,N'-Bis(naphthalen-1-yl)-N,N'-bis(phenyl)benzidine (NPB), 4,4',4"-Tris(N-3-methylphenyl-N-phenylamino)triphenylamine (m-MTDATA) or N,N'-Bis(3-methylphenyl)-N,N'-bis(phenyl)benzidine (TPD). However, the embodiments of the present disclosure are not limited thereto.

Some embodiments of the present disclosure provide a manufacturing method for an OLED device. The method includes forming a first electrode 21, a light-emitting layer 23, an electron blocking layer 24 and a second electrode 25, and the first electrode 21, the light-emitting layer 23, the electron blocking layer 24 and the second electrode 25 being stacked in sequence.

In some embodiments, forming a first electrode 21, a light-emitting layer 23, an electron blocking layer 24 and a second electrode 25, includes S01 to S04.

S01, in which a first electrode 21 is formed on a substrate 20;

S02, in which a light-emitting layer 23 is formed on a side of the first electrode 21 in a thickness direction of the substrate 20;

S03, in which an electron blocking layer 24 is formed on a side of the light-emitting layer 23 away from the first electrode 21; and S04, in which a second electrode 25 is formed on a side of the electron blocking layer 24 away from the light-emitting layer 23.

That is, the first electrode 21, the light-emitting layer 23, the electron blocking layer 24 and the second electrode 25 are sequentially formed on a side of the substrate 20, in the thickness direction of the substrate 20, to form an OLED device as shown in FIG. 4C.

In some other embodiments, forming a first electrode 21, a light-emitting layer 23, an electron blocking layer 24 and a second electrode 25, includes: forming the second electrode 25, the electron blocking layer 24, the light-emitting layer 23, and the first electrode 21 sequentially on a side of the substrate 20, in the thickness direction of the substrate 20, to form an OLED device as shown in FIG. 4B.

In some embodiments, S02 includes S021 and S202.

S021, in which a first sub-layer is formed, includes S0212, evaporating a host material; and S022, in which a second sub-layer is formed, includes S0222, evaporating the host material and a trap material, simultaneously.

The embodiments of the present disclosure are not limit an order of S021 and S022. For example, in a case where the second electrode 25 and the electron blocking layer 24 are formed first, S021 may be performed first, and then S022 may be performed. For another example, in a case of the first electrode 21 is formed first, S022 may be performed first, and then S021 may be performed, so as to form the light-emitting layer 23 including the first sub-layer 231 and the second sub-layer 232 as shown in FIG. 8.

In some other embodiments, S02 includes S021' and S202'.

S021', in which a first sub-layer is formed, includes S0212', evaporating a host material; and S022', in which a second sub-layer is formed, includes S0222', evaporating a trap material. S021' and S022' are alternately performed to form the light-emitting layer 23 including a plurality of first sub-layers 231 and a plurality of second sub-layers 232.

The embodiments of the present disclosure are not limit an order of S021' and S022', as long as it is ensured that a sub-layer closest to the electron blocking layer 24 in the light-emitting layer 23 is a first sub-layer 231. For example, in the case where the first electrode 21 is formed first, S021' may be performed first, or S022' may be performed first. For example, S022', S021', S022' and S021' are sequentially performed to form the light-emitting layer 23 including two first sub-layers 231 and two second sub-layers 232 as shown in FIG. 11. As another example, in the case where the second electrode 25 and the electron blocking layer 24 are formed first, S021' is performed first, and then S022' is performed.

In some embodiments, S021 further includes S0211, and S022 further includes S0221.

S0211, in which a guest material is evaporated while the host material is evaporated; and S0221, in which the guest material is evaporated while the host material and the trap material are evaporated simultaneously.

The embodiments of the present disclosure are not limit an order of S0211 and S0221, as long as it is ensured that S0212 and S0211 are performed simultaneously, and S0222 and S0221 are performed simultaneously. For example, in the case where the second electrode 25 and the electron blocking layer 24 are formed first, S0212 and S0211 are performed simultaneously, and then S0222 and S0221 are performed simultaneously. For another example, in the case where the first electrode 21 is formed first, S0222 and S0221 are performed simultaneously and then S0212 and S0211 are performed simultaneously, so as to form the light-emitting layer 23 including one first sub-layer 231 and one second sub-layer 232 as shown in FIG. 8.

In yet some other embodiments, S021' further includes S0211', and S022' further includes S0221'.

S0211', in which the guest material is evaporated while the host material is evaporated; and S0221', in which the guest material is evaporated while the trap material is evaporated.

The embodiments of the present disclosure are not limit the order of S0211' and S0221', as long as it is ensured that S0212' and S0211' are performed simultaneously. For example, in the case where the first electrode 21 is formed first, S0212' and S0211' may be performed simultaneously, or S0222' and S0221' may be performed simultaneously. For example, S0222' and S0221' are performed simultaneously first, then S0212' and S0211' are performed simultaneously, then S0222' and S0221' are performed simultaneously, and then S0212' and S0211' are performed simultaneously, so as to form the light-emitting layer 23 including two first sub-layers 231 and two second sub-layers 232 as shown in FIG. 12.

Two specific examples of OLED devices are provided below to illustrate an effect of adding the trap material to the material of the light-emitting layer on performance of an OLED device.

Example 1: the second electrode 25 is an anode, and a material of the second electrode 25 is ITO; a material of the hole injection layer is $MoO_3$, and a thickness thereof is 5 nm to 30 nm; a material of the hole transport layer is NPB, and a thickness thereof is 1000 nm to 1300 nm; a material of the electron blocking layer is mCBP, and a thickness thereof is 10 nm to 80 nm; a material of the light-emitting layer includes mEMCB, $Ir(ppy)_3$ and CBP, and a light-emitting layer includes one first sub-layer and one second sub-layer, a material of the first sub-layer includes the host material (mEMCB) and the guest material ($Ir(ppy)_3$), a material of the second sub-layer includes the host material (mEMCB), the trap material (CBP) and the guest material ($Ir(ppy)_3$), and a thickness of the light-emitting layer is 20 nm to 40 nm, and a thickness of the second sub-layer is 10 nm to 20 nm; a material of the hole blocking layer is BCP, and a thickness thereof is 5 nm to 10 nm; a material of the electron transport layer is a mixture of Bephen and LIQ, and a thickness thereof is 20 nm to 35 nm; a material of the electron injection layer is LIQ, and a thickness thereof is 1 nm to 3 nm; and the first electrode 21 is a cathode, and a material of the first electrode 21 is Mg—Ag alloy.

Example 2: the light-emitting layer is a single-layer, and the material of the light-emitting layer includes the host material (mEMCB) and the guest material ($Ir(ppy)_3$). Except that the material of the light-emitting layer is different from that of the OLED device of Example 1, the materials of other layers are each completely the same as those of the OLED device of Example 1, the thicknesses of the other layers are each completely the same as those of the OLED device of Example 1, and the thickness of the light-emitting layer is the same as that of the OLED device of Example 1.

Figure 16:
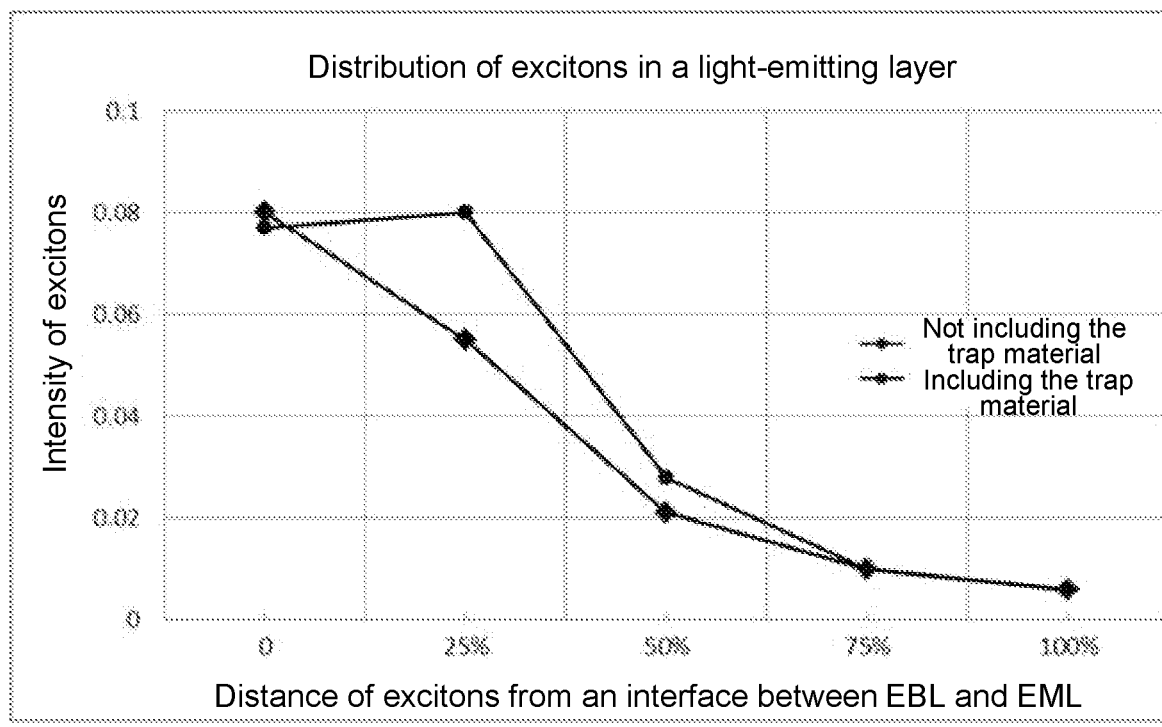
FIG. 16 is a comparison diagram between the distribution of excitons in the light-emitting layer of the OLED device in the prior art and a distribution of excitons in a light-emitting layer of an OLED device in some embodiments.

FIG. 16 shows distributions of excitons in light-emitting layers 23, due to an action of an electric field, in an OLED device in which a material of a light-emitting layer 23 includes the trap material and in an OLED device in which a material of a light-emitting layer 23 does not include the trap material. It may be seen from FIG. 16 that, compared with the OLED device in which the material of the light-emitting layer 23 does not include the trap material, in the OLED device in which the material of the light-emitting layer 23 includes the trap material, excitons are most distributed at a position with a distance to an interface of the light emitting layer 23 and the electron blocking layer 24 being 25% of a thickness of the light emitting layer 23 due to the action of the electric field, thereby preventing excessive electrons from being transmitted and accumulated at the interface of the EML and the EBL.

Some embodiments of the present disclosure provide a manufacturing method for an OLED display apparatus, including S100 and S200.

S100, in which a base 11 is provided; and

S200, in which a plurality of OLED devices are manufactured on the base 11, and each OLED device is manufactured by the manufacturing method for the OLED device in any one of the above embodiments.

Herein, the substrate 20 in S01 of any of the above embodiments is the base 11 in S100.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An organic light-emitting diode (OLED) device, comprising:
   a first electrode;
   a light-emitting layer, a material of the light-emitting layer including a host material and a trap material, a lowest unoccupied molecular orbital energy level of the trap material being lower than a lowest unoccupied molecular orbital energy level of the host material, and a highest occupied molecular orbital energy level of the trap material being not higher than a highest occupied molecular orbital energy level of the host material;
   an electron blocking layer, the lowest unoccupied molecular orbital energy level of the trap material being lower than a lowest unoccupied molecular orbital energy level of a material of the electron blocking layer; and
   a second electrode; wherein
   the first electrode, the light-emitting layer, the electron blocking layer and the second electrode are stacked in sequence.

2. The OLED device according to claim 1, wherein the light-emitting layer includes at least one first sub-layer and at least one second sub-layer that are stacked; a material of the at least one first sub-layer includes the host material, and a material of the at least one second sub-layer includes the trap material.

3. The OLED device according to claim 2, wherein of the at least one first sub-layer and the at least one second sub-layer, a sub-layer closest to the electron blocking layer is a first sub-layer.

4. The OLED device according to claim 3, wherein a thickness of the first sub-layer is greater than or equal to 50% of a thickness of the light-emitting layer.

5. The OLED device according to claim 2, wherein the material of the at least one second sub-layer further includes the host material, and the trap material is doped in the host material.

6. The OLED device according to claim 5, wherein the at least one first sub-layer includes one first sub-layer, and the at least one second sub-layer includes one second sub-layer.

7. The OLED device according to claim 5, wherein of the light-emitting layer, a mass ratio of the trap material to the host material is 3:7 to 7:3.

8. The OLED device according to claim 2, wherein a total number of the at least one first sub-layer and the at least one second sub-layer is greater than two, the first sub-layer and the second sub-layer are alternately stacked.

9. The OLED device according to claim 8, wherein a thickness of each second sub-layer is 3% to 10% of a thickness of the light-emitting layer.

10. The OLED device according to claim 2, wherein each of the at least one first sub-layer and the at least one second sub-layer further includes a guest material.

11. The OLED device according to claim 10, wherein of the light-emitting layer, a mass ratio of the guest material to the host material is 1:100 to 15:100; and/or
    of the light-emitting layer, a mass ratio of the guest material to the trap material is 1:100 to 15:100.

12. The OLED device according to claim 1, wherein the trap material includes one of 4,4'-Di(9H-carbazol-9-yl)-biphenyl, 1,3,5-tri(9H-carbazol-9-yl)benzene (TCP), and 3,3-Di(9H-carbazol-9-yl)-1,1'-biphenyl (mCBP).

13. The OLED device according to claim 1, further comprising:
    a hole blocking layer disposed between the first electrode and the light-emitting layer; and/or
    an electron injection layer disposed between the first electrode and the hole blocking layer, an electron transport layer disposed between the electron injection layer and the hole blocking layer, a hole injection layer disposed between the second electrode layer and the electron blocking layer, and a hole transport layer disposed between the hole injection layer and the electron blocking layer.

14. An OLED display apparatus, comprising a plurality of OLED devices according to claim 1.

15. A manufacturing method for an organic light-emitting diode (OLED) device, comprising:
    forming a first electrode, a light-emitting layer, an electron blocking layer and a second electrode; wherein
    the first electrode, the light-emitting layer, the electron blocking layer and the second electrode are stacked in sequence, and a material of the light-emitting layer includes a host material and a trap material;
    a lowest unoccupied molecular orbital energy level of the trap material is lower than a lowest unoccupied molecular orbital energy level of the host material, a highest occupied molecular orbital energy level of the trap material is not higher than a highest occupied molecular orbital energy level of the host material, and the lowest unoccupied molecular orbital energy level of the trap material is lower than a lowest unoccupied molecular orbital energy level of a material of the electron blocking layer.

16. The method according to claim 15, wherein the light-emitting layer includes at least one first sub-layer and at least one second sub-layer that are stacked; wherein
    forming the light-emitting layer includes:
        forming a first sub-layer of the at least one first sub-layer including evaporating the host material; and
        forming a second sub-layer of the at least one second sub-layer, including evaporating the host material and the trap material, simultaneously.

17. The method according to claim 15, wherein the light-emitting layer includes at least one first sub-layer and at least one second sub-layer that are stacked; a total number of layers of the at least one first sub-layer and the at least one second sub-layer is greater than two, and the first sub-layer and the second sub-layer are alternately stacked; wherein
    forming the light-emitting layer includes:
        forming a first sub-layer of the at least one first sub-layer including evaporating the host material; and
        forming a second sub-layer of the at least one second sub-layer including evaporating the trap material.

18. The method according to claim 16, wherein the light-emitting layer further includes a guest material; wherein
    forming the first sub-layer further includes: evaporating the guest material while the host material is evaporated; and forming the second sub-layer further includes: evaporating the guest material while the trap material is evaporated.

19. A manufacturing method for an organic light-emitting diode (OLED) display apparatus, the method comprising:
providing a base; and
manufacturing a plurality of OLED devices on the base, each OLED device being manufactured by the method according to claim 15.

20. The method according to claim 15, wherein forming the first electrode, the light-emitting layer, the electron blocking layer, and the second electrode, includes:
forming the first electrode, the light-emitting layer, the electron blocking layer, and the second electrode in sequence; or
forming the second electrode, the electron blocking layer, the light-emitting layer, and the first electrode in sequence.

* * * * *